United States Patent
Hainz et al.

(10) Patent No.: US 7,405,809 B2
(45) Date of Patent: Jul. 29, 2008

(54) ILLUMINATION SYSTEM PARTICULARLY FOR MICROLITHOGRAPHY

(75) Inventors: Joachim Hainz, Aalen (DE); Wolfgang Singer, Aalen (DE); Erich Schubert, Jestetten (DE)

(73) Assignee: Carl Zeiss SMT AG, Oberkochen (DE)

( * ) Notice: Subject to any disclaimer, the term of this patent is extended or adjusted under 35 U.S.C. 154(b) by 129 days.

(21) Appl. No.: 11/384,636

(22) Filed: Mar. 21, 2006

(65) Prior Publication Data

US 2006/0208206 A1 Sep. 21, 2006

Related U.S. Application Data

(60) Provisional application No. 60/663,786, filed on Mar. 21, 2005.

(51) Int. Cl.
*G03B 27/42* (2006.01)

(52) U.S. Cl. ............... 355/67; 355/71; 378/34; 378/35; 378/145; 378/154; 250/492.2

(58) Field of Classification Search .......... 355/53, 355/67, 71; 378/34, 35, 145, 146; 250/492.2
See application file for complete search history.

(56) References Cited

U.S. PATENT DOCUMENTS

| | | | |
|---|---|---|---|
| 5,098,184 A | 3/1992 | van den Brandt et al. | 353/102 |
| 5,339,346 A | 8/1994 | White | 378/34 |
| 5,361,292 A | 11/1994 | Sweatt | 378/34 |
| 5,402,267 A | 3/1995 | Fürter et al. | 359/727 |
| 5,418,583 A | 5/1995 | Masumoto | 353/38 |
| 5,581,605 A | 12/1996 | Murakami et al. | 378/84 |
| 5,737,137 A | 4/1998 | Cohen et al. | 359/859 |
| 6,195,201 B1 | 2/2001 | Kock et al. | 359/366 |
| 6,198,793 B1 | 3/2001 | Schultz et al. | 378/34 |
| 6,353,570 B2 | 3/2002 | Hwang et al. | 365/225.7 |
| 6,452,661 B1 | 9/2002 | Komatsuda | 355/67 |
| 6,570,168 B1 * | 5/2003 | Schultz et al. | 355/67 |
| 6,947,124 B2 * | 9/2005 | Antoni et al. | 355/67 |
| 2003/0086524 A1 | 5/2003 | Schultz et al. | 378/34 |
| 2004/0028175 A1 * | 2/2004 | Antoni et al. | 378/34 |
| 2004/0140440 A1 * | 7/2004 | Schultz et al. | 250/504 R |

* cited by examiner

*Primary Examiner*—Della J. Rutledge
(74) *Attorney, Agent, or Firm*—Taylor & Aust, P.C.

(57) ABSTRACT

An illumination system for scannertype microlithography along a scanning direction with a light source emitting a wavelength especially $\leq 193$ nm. The illumination system includes a plurality of raster elements. The plurality of raster elements is imaged into an image plane of the illumination system to produce a plurality of images being partially superimposed on a field in the image plane. The field defines a non-rectangular intensity profile in the scanning direction.

23 Claims, 10 Drawing Sheets

ILLUMINATION SYSTEM PARTICULARLY FOR MICROLITHOGRAPHY

CROSS REFERENCE TO RELATED APPLICATIONS

This is a non-provisional application based upon U.S. provisional patent application Ser. No. 60/663,786, entitled "ILLUMINATION SYSTEM PARTICULARLY FOR MICROLITHOGRAPHY", filed Mar. 21, 2005.

BACKGROUND OF THE INVENTION

1. Field of the Invention

The invention relates to an illumination system for wavelengths $\leq$193 nm as well as a projection exposure apparatus with such an illumination system.

In order to be able to further reduce the structural widths of electronic components, particularly in the submicron range, it is necessary to reduce the wavelengths of the light utilized for microlithography. Lithography with very deep UV (ultraviolet) radiation, so called VUV (Very deep UV) lithography or with soft x-ray radiation, so-called EUV (extreme UV) lithography, is conceivable at wavelengths smaller than 193 nm, for example.

2. Description of the Related Art

An illumination system for a lithographic device, which uses EUV radiation, has been made known from U.S. Pat. No. 5,339,346. For uniform illumination in the reticle plane and filling of the pupil, U.S. Pat. No. 5,339,346 proposes a condenser, which is constructed as a collector lens and includes at least 4 pairs of mirror facets, which are arranged symmetrically. A plasma light source is used as the light source.

In U.S. Pat. No. 5,737,137, an illumination system with a plasma light source including a condenser mirror is shown, in which an illumination of a mask or a reticle to be illuminated is achieved by way of spherical mirrors.

U.S. Pat. No. 5,361,292 shows an illumination system, in which a plasma light source is provided, and the point plasma light source is imaged in an annular illuminated surface by way of a condenser, which has five aspherical mirrors arranged off-center.

From U.S. Pat. No. 5,581,605, an illumination system, is known, in which a photon beam is split into a multiple number of secondary light sources by way of a plate with concave raster elements. In this way, a homogeneous or uniform illumination is achieved in the reticle plane. The imaging of the reticle on the wafer to be exposed is produced by way of conventional reduction optics. A gridded mirror is precisely provided with equally curved elements in the illumination beam path. The contents of the above-mentioned patents are incorporated by reference.

From U.S. Pat. No. 5,418,583, an optical illumination system with refractive optical elements is known and a light source a metal halide lamp is disclosed.

From U.S. Patent Application Publication 2003/0086524 A1, a double-faceted illumination system with a first optical element with a first raster element and a second optical element with a second raster element is known. The first optical element provides for a secondary light source. According to this publication the shape of the second raster element depends on the shape of the secondary light source. For circular secondary light sources the second raster elements are circular whereas for a dense packaging the second raster element is hexagonal.

From U.S. Pat. No. 5,098,184, an illumination system for a projection system is made known with pupil-raster-elements having the shape of the exit pupil of the illumination system.

What is needed in the art is to provide an illumination system for a lithographic device, especially for wavelength $\leq$193 nm, which overcomes the disadvantages of the prior art and especially provides for an even better performance. Especially the filling degree in the exit pupil should be improved. Furthermore, the uniformity in the exit pupil should be improved over systems already disclosed in the state of the art.

SUMMARY OF THE INVENTION

The present invention provides an illumination system for microlithography that fulfills the requirements for advanced lithography especially with wavelength less or equal to 193 nm. The system illuminates a structured reticle arranged in the image plane of the illumination system, which will be imaged by a projection objective onto a light sensitive substrate. In stepper-type lithography systems the reticle is illuminated with a rectangular field, wherein a predetermined uniformity of the light intensity inside the field is required, for example better than ±5%. In scanner-type lithography systems the reticle is illuminated with a rectangular or arc-shaped field, wherein a predetermined uniformity of the scanning energy distribution inside the field is required, for example better than ±5%. The scanning energy is defined as the line integral over the light intensity in the scanning direction. The shape of the field is dependent on the type of the projection objective. All reflective projection objectives or so called catoptric objectives typically have an arc-shaped field, which is given by a segment of an annulus. A further feature is the illumination of the exit pupil of the illumination system, which is located at the entrance pupil of the projection objective. A nearly field-independent illumination of the exit pupil is provided. Furthermore, the present invention provides for a geometric filling factor higher than 70%, preferably higher than 80%, most preferable higher than 90%.

According to the present invention the illumination system includes a light source emitting a wavelength $\leq$193 nm. The inventive illumination system further includes a first optical component having a first plurality of first raster elements and a second optical component having a second plurality of second raster elements. A first member of the first plurality of first raster elements divides an incoming ray bundle into a plurality of light bundles. The first member of the plurality of light bundles is deflected to a first member of the plurality of second raster elements to provide an image of the first member of the plurality of first raster elements on a field in an image plane. A second member of the first plurality of first raster element deflects a second member of the plurality of light bundles to a second member of the plurality of second raster elements to provide an image of the second member of the plurality of first raster elements on the field. The image of the first member of the plurality of first raster elements and the image of the second member of the plurality of first raster elements are partially superimposed, and the field defines a non-rectangular intensity profile in the scanning direction.

According to the present invention the shape of the first member of the second raster elements is substantially different to the shape of the second member of the second raster elements. The plurality of first raster elements provide for a plurality of secondary light sources. Each of the secondary light sources has a certain shape. Preferably the shape of the second raster elements correspond to the shape of the secondary light sources. In a further preferred embodiment the deflected ray bundles have a deflection angle, and at least two of the deflection angles are different from one another.

In an even more preferred embodiment the plurality of second raster elements are arranged on a raster element plate. Preferably the shape and the arrangement of the second raster elements on that raster element plate is chosen such, that an area of more than 70%, preferably more than 80%, most preferably more than 90% of the exit pupil of the illumination system is illuminated.

The area of the exit pupil is defined by a light cone with an opening equal to the numerical aperture (NA) of the illumination system emitting from one field point in the reticle plane. The area of the exit pupil is then given by the intersection of the described light cone with the plane of the exit pupil.

The illuminated area in the exit pupil can have any shape. Preferred is a circular shape, an annular shape, a quadrupolar shape or a bipolar shape.

In a preferred embodiment of the present invention at least two of the first raster elements are arranged symmetric to an axis of symmetry, and the at least two of the first raster elements deflect the plurality of incoming ray bundles with the first deflection angles to the corresponding one of the plurality of second raster elements to fill an exit pupil of the illumination system nearly point symmetric to a center of the exit pupil. By filling the exit pupil nearly point symmetric the subpupils with equal energy are point symmetric to the center of the pupil and therefore telecentry is enhanced.

With the inventive concept it is possible to optimize the pupil illumination.

In an illumination system according to the state of the art the geometric filling factor, which is the ratio of the illuminated area in the exit pupil and the area of the exit pupil is lower than 70%. Especially at the margin of the exit pupil the illumination decreases.

By using second raster elements with a shape, which is adopted to the shape of each of the secondary light sources, a geometric filling factor higher than 70%, preferably higher than 80%, most preferably higher than 90% can be achieved. The illumination of the exit pupil can be further enhanced, if one fills the exit pupil nearly point symmetric to the center of the exit pupil. For a conventional (circular) setting the illumination of the exit pupil is optimal if the filling factor of the exit pupil is 100% and if the illuminated exit pupil has a constant intensity distribution. An illumination system in accordance with the present invention can also be employed in a projection exposure apparatus for microlithography. Such a projection exposure apparatus includes, in addition to the illumination system, a reticle located at the image plane, a light-sensitive object on a support system, and a projection objective to image the reticle onto the light-sensitive object.

Typical light sources for wavelengths between 100 nm and 200 nm are excimer lasers, for example an ArF-Laser for 193 nm, an $F_2$-Laser for 157 nm, an $Ar_2$-Laser for 126 nm and an NeF-Laser for 109 nm. For systems in this wavelength region refractive components of $SiO_2$, $CaF_2$, $BaF_2$ or other crystallites are used. Since the transmission of the optical materials deteriorates with decreasing wavelength, the illumination systems are designed with a combination of refractive and reflective components. For wavelengths in the EUV wavelength region, between 10 nm and 20 nm, the projection exposure apparatus is designed as all-reflective. A system which includes only reflective components is a so called catoptric system. A typical EUV light source is a Laser-Produced-Plasma-source, a Pinch-Plasma-Source, a Wiggler-Source or an Undulator-Source.

In case of a catoptric system the first raster elements are field mirror raster elements and the second raster elements are pupil mirror raster elements. When in this application it is generally spoken about first raster elements this relates for a man skilled in the art to field mirror raster elements in case of all-reflective or catoptric illumination systems. When in this application it is generally spoken about second raster elements this relates for a man skilled in the art to pupil mirror raster elements in case of a all-reflective or catoptric illumination system.

The light of this primary light source is collected by a collector unit and directed to the first optical element, with a plurality of first raster elements. Each first raster element corresponds to one secondary light source and focuses an incoming ray bundle, defined by all rays intersecting the first raster element, to the corresponding secondary light source. The secondary light sources are arranged in a pupil plane of the illumination system or nearby this plane. A field mirror or lens might be arranged between the pupil plane and the image plane of the illumination system to image the secondary light sources into an exit pupil of the illumination system, which corresponds to the entrance pupil of a following projection objective. The images of the secondary light sources in the exit pupil of the illumination system are therefore called tertiary light sources.

The first raster elements are imaged into the image plane, wherein their images are at least partially superimposed on a field to be illuminated. Therefore, they are known as field raster elements, especially field mirror raster elements in the reflective case or field honeycombs. If the light source is a point-like source, the secondary light sources are also point-like. In this case the imaging of each of the field mirror raster elements can be explained visually with the principle of a "camera obscura", with the small hole of the camera obscura at the position of each corresponding secondary light source, respectively.

To superimpose the images of the field mirror raster elements in the image plane of the illumination system the incoming ray bundles are deflected by the field mirror raster elements with first deflection angles, which are not equal for each of the field mirror raster elements but at least different for two of the field mirror raster elements. Therefore individual deflection angles for the field raster elements are designed. For each field raster element a plane of incidence is defined by the incoming and deflected centroid ray selected from the incoming ray bundle. Due to the individual deflection angles, at least two of the incidence planes are not parallel.

In advanced microlithography systems the light distribution in the entrance pupil of a projection objective must fulfill special requirements such as having an overall shape or uniformity. Since the secondary light sources are imaged into the exit pupil, their arrangement in the pupil plane of the illumination system determines the light distribution in the exit pupil. With the individual deflection angles of the field mirror raster elements a predetermined arrangement of the secondary light sources can be achieved, independent of the directions of the incoming ray bundles. For reflective first raster elements, or so called field mirror raster elements the deflection angles are generated by the tilt angles of the field mirror raster elements. The tilt axes and the tilt angles are determined by the directions of the incoming ray bundles and the positions of the secondary light sources, to which the reflected ray bundles are directed. In an ideal case the light distribution is such, that the exit pupil from an energetic point of view is homogenous, e.g. in such a case of a substantially homogenous illumination the direction of the energetic centroid ray differs only by 0.1 mrad (milliradian) to the direction of the principal ray and elliptically is smaller than 1%.

For refractive first raster element the deflection angles are generated by lenslets, which have a prismatic optical power. The refractive first raster elements can be lenslets with an optical power having a prismatic contribution or they can be a combination of a single prism and a lenslet. The prismatic optical power is determined by the directions of the incoming ray bundles and the positions of the corresponding secondary light sources. Given the individual deflection angles of the first raster elements, the beam path to the plate with the raster elements can be either convergent or divergent. The slope values of the first raster elements at the centers of the first raster elements has then to be similar to the slope values of a surface with negative power to reduce the convergence of the beam path, or with positive power to increase the divergence of the beam path. Finally the field raster elements deflect the incoming ray bundles to the corresponding secondary light sources having predetermined positions depending on the illumination mode of the exit pupil.

The diameter of the beam path is preferably reduced after the collector unit to arrange filters or transmission windows with a small size. This is possible by imaging the light source with the collector unit to an intermediate image. The intermediate image is arranged between the collector unit and the plate with the field mirror raster elements. After the intermediate image of the light source, the beam path diverges. An additional mirror to condense the diverging rays is not necessary due to the field mirror raster elements having deflecting optical power.

The field mirror raster elements are preferably arranged in a two-dimensional array on a substrate or plate without overlapping. For reflective first raster elements, or so called field mirror raster elements the plate can be a planar plate or a curved plate. To minimize the light losses between adjacent field mirror raster elements they are arranged only with intermediate spaces between them, which are necessary for the mountings of the field mirror raster elements. Preferably, the field mirror raster elements are arranged in a plurality of rows having at least one field raster element and being arranged among one another. In the rows the field mirror raster elements are put together at the smaller side of the field raster elements. At least two of these rows are displaced relative to one another in the direction of the rows. In one embodiment each row is displaced relative to the adjacent row by a fraction of a length of the field raster elements to achieve a regular distribution of the centers of the field mirror raster elements. The fraction is dependent on the side aspect ratio and is preferably equal to the square root of the length of one field mirror raster element. In another embodiment the rows are displaced in such a way that the field mirror raster elements are illuminated almost completely.

Preferably, only these field mirror raster elements are imaged into the image plane, which are completely illuminated. This can be realized with a masking unit in front of the plate with the field raster elements, or with an arrangement of the field raster elements wherein 90% of the field raster elements are completely illuminated.

According to the present invention a second optical element with second raster elements in the light path after the first optical element with first raster elements is arranged. Each of the first raster element corresponds to one of the second raster elements. Therefore, the deflection angles of the first raster elements are designed to deflect the ray bundles impinging on the first raster elements to the corresponding second raster elements.

The second raster elements are preferably arranged near the place, where the secondary light sources are provided. The secondary raster elements image together with the field lens or field mirror the first raster elements or field mirror raster elements into the image plane of the illumination system, wherein the images of the field mirror raster elements are at least partially superimposed. The second raster elements are called pupil raster elements, especially pupil mirror raster elements in a catoptric illumination system or pupil honeycombs. To avoid damaging the second raster elements due to the high intensity at the secondary light sources, the second raster elements are preferably arranged defocused of the secondary light sources, preferable in a range from 0 mm to 10% of the distance between the first and second raster elements.

The secondary light source have in the plane, where the pupil mirror raster elements are situated, preferably on a raster element plate a certain shape, e.g. a circular shape. According to the present invention the shape of the pupil raster elements is choosen such that their shape is similar to the shape of the corresponding secondary light sources. For extended secondary light sources the pupil mirror raster elements preferably furthermore have a positive optical power to image the corresponding field mirror raster elements, which are arranged optically conjugated to the image plane. The second raster elements can be concave mirrors in case of pupil mirror raster elements or lenslets with positive optical power for a refractive illumination system.

The pupil mirror raster elements deflect incoming ray bundles impinging on the pupil mirror raster elements with second deflection angles in such a way that the images of the field mirror raster elements in the image plane are at least partially superimposed. This is the case if a ray intersecting the field mirror raster element and the corresponding pupil mirror raster element in their centers intersects the image plane in the center of the illuminated field or nearby the center. Each pair of a field mirror raster element and a corresponding pupil mirror raster element forms a light channel.

The second deflection angles are not equal for each pupil mirror raster element. They are preferably individually adapted to the directions of the incoming ray bundles and the requirement to superimpose the images of the field mirror raster elements at least partially in the image plane. With the tilt axis and the tilt angle for a reflective second raster element or with the prismatic optical power for a refractive second raster element the second deflection angle can be individually adapted.

If both, the field mirror raster elements and the pupil mirror raster elements deflect incoming ray bundles in predetermined directions, the two-dimensional arrangement of the field raster mirror elements can be made different from the two-dimensional arrangement of the pupil mirror raster elements. Wherein the arrangement of the field raster mirror elements is adapted to the illuminated area on the plate with the field mirror raster elements, the arrangement of the pupil mirror raster elements is determined by the kind of illumination mode required in the exit pupil of the illumination system. So the images of the secondary light sources can be arranged in a circle, but also in an annulus to get an annular illumination mode or in four decentered segments to get a Quadrupol illumination mode. Preferable for each illumination pattern the secondary light sources are arranged different in the exit pupil.

According to the present invention, each one of the second raster element or the pupil mirror raster elements have the shape of the corresponding secondary light source to provide a optimized illumination of the exit pupil.

The aperture in the image plane of the illumination system is approximately defined by the quotient of the half diameter of the exit pupil of the illumination system and the distance between the exit pupil and the image plane of the illumination system. Typical apertures in the image plane of the illumination system are in the range of 0.02 and 0.1. By deflecting the incoming ray bundles with the field mirror and pupil mirror raster elements a continuous light path can be achieved. It is also possible to assign each field mirror raster element to any of the pupil raster elements. Therefore the light channels can be mixed to minimize the deflection angles or to redistribute the intensity distribution between the plate or substrate with the field raster mirror elements and the plate with the pupil raster elements.

Imaging errors such as distortion introduced by the field lens or field mirrors can be compensated for with the pupil mirror raster elements being arranged at or nearby the secondary light sources. Therefore the distances between the pupil mirror raster elements are preferably irregular. The distortion due to tilted field mirrors for example is compensated for by increasing the distances between the pupil mirror raster elements in a direction perpendicular to the tilt axis of the field mirrors. In a preferred embodiment the pupil mirror raster elements are arranged on curved lines to compensate for the distortion due to a field mirror, which transforms the rectangular image field to a segment of an annulus by conical reflection. By tilting the field mirror raster elements the secondary light sources can be positioned at or nearby the distorted grid of the corresponding pupil mirror raster elements.

For field mirror and pupil mirror raster elements the beam path has to be folded at the plate with the field mirror raster elements and at the plate with the pupil mirror raster elements to avoid vignetting. Typically, the folding axes of both plates are parallel. Another requirement for the design of the illumination system is to minimize the incidence angles on the field mirror and pupil mirror raster elements. Therefore the folding angles have to be as small as possible. This can be achieved if the extent of the plate with the field raster elements is approximately equal to the extent of the plate with the pupil mirror raster elements in a direction perpendicular to the direction of the folding axes, or if it differs less than ±10%.

Since the secondary light sources are imaged into the exit pupil of the illumination system, their arrangement determines the illumination mode of the pupil illumination. Typically the overall shape of the illumination in the exit pupil is circular. The diameter of the illuminated region can be in the order of 60%-80% of the diameter of the entrance pupil of the projection objective. Alternatively the diameters of the exit pupil of the illumination system and the entrance pupil of the projection objective in another embodiment can be equal.

All-reflective or catoptric projection objectives used in the EUV wavelength region have typically an object field being a segment of an annulus. Therefore the field in the image plane of the illumination system in which the images of the field mirror raster elements are at least partially superimposed has preferably the same shape. The shape of the illuminated field can be generated by the optical design of the components or by masking blades that have to be added nearby the image plane or in a plane conjugated to the image plane.

The field mirror raster elements are preferably rectangular.

The field mirror raster elements can also have the shape of the field in the field plane. If the field in the field plane is a segment of a ring field, then the field raster elements are preferably of an arcuate shape. Field mirror raster elements in an illumination system, which have the shape of the field in the field plane are shown for example in U.S. Pat. No. 6,452,661 or U.S. Pat. No. 6,195,201, the content of both applications is incorporated herein fully by reference. In U.S. Pat. No. 6,452,661 or U.S. Pat. No. 6,195,201 incorporated herein by reference, the shape of the field mirror raster elements is arc-shaped, since the field to be illuminated in the field plane is arc-shaped.

If the field mirror raster elements are of rectangular shape, then the field is shaped by so called field mirrors as shown e.g. in U.S. Pat. No. 6,198,793, incorporated herein by reference. Rectangular field mirror raster elements have the advantage that they can be arranged in rows being displaced against each other. Depending on the field to be illuminated they have a side aspect ratio in the range of 5:1 and 20:1. The length of the rectangular field mirror raster elements is typically between 15 mm and 50 mm, the width is between 1 mm and 4 mm.

To illuminate an arc-shaped field in the image plane with rectangular field mirror raster elements the field lens or field mirror preferably includes a first field mirror for transforming the rectangular images of the rectangular field mirror raster elements to arc-shaped images. The arc length is typically in the range of 80 mm to 105 mm, the radial width in the range of 5 mm to 9 mm. The transformation of the rectangular images of the rectangular field mirror raster elements can be done by conical reflection with the first field mirror being a grazing incidence mirror with negative optical power. In other words, the imaging of the field mirror raster elements is distorted to get the arc-shaped images, wherein the radius of the arc is determined by the shape of the object field of the projection objective. The first field mirror is preferably arranged in front of the image plane of the illumination system, wherein there should be a free working distance. For a configuration with a reflective reticle in a catoptric illumination system the free working distance has to be adapted to the fact that the rays traveling from the reticle to the projection objective are not vignetted by the first field mirror.

The illumination system as described before can be used preferably in a projection exposure apparatus including the illumination system, a reticle arranged in the image plane of the illumination system and a projection objective to image the reticle onto a wafer arranged in the image plane of the projection objective. Both, reticle and wafer are arranged on a support unit, which allows the exchange or scan of the reticle or wafer.

The projection objective can be a catadioptric lens, as known from U.S. Pat. No. 5,402,267, incorporated herein by reference, for wavelengths in the range between 100 nm and 200 nm. These systems have typically a transmission reticle. For the EUV wavelength range the projection objectives are preferably all-reflective systems or so called catoptric projections system with four to eight mirrors as known for example from U.S. Pat. No. 6,353,570, incorporated herein by reference, showing a six mirror projection lens. These systems have typically a reflective reticle.

For systems with a reflective reticle the illumination beam path between the light source and the reticle and the projection beam path between the reticle and the wafer preferably interfere only nearby the reticle, where the incoming and reflected rays for adjacent object points are traveling in the same region. If there is no further crossing of the illumination and projection beam path it is possible to separate the illumination system and the projection objective except for the reticle region.

The projection objective has preferably a projection beam path between the reticle and the first imaging element that is convergent toward the optical axis of the projection objective. Especially for a projection exposure apparatus with a reflective reticle the separation of the illumination system and the projection objective is easier to achieve.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Corresponding reference characters indicate corresponding parts throughout the several views. The exemplifications set out herein illustrate one preferred embodiment of the invention, in one form, and such exemplifications are not to be construed as limiting the scope of the invention in any manner.

DETAILED DESCRIPTION OF THE INVENTION

Figure 1:
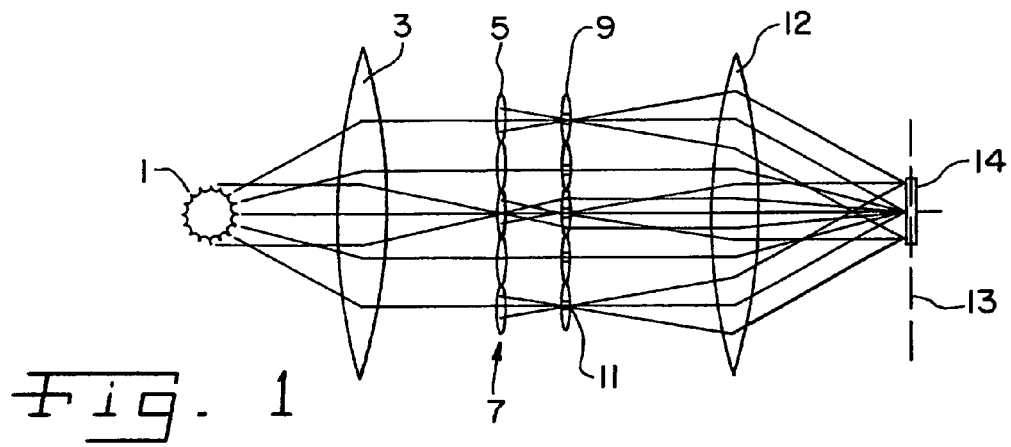
FIG. 1 is a schematic view of a principle diagram of the beam path of a system with two raster element plates.

Referring now to the drawings, and, more particularly to FIGS. 1-2, a system is provided for any desired illumination distribution in a plane, which satisfies the requirements with reference to uniformity and telecentricity.

In FIG. 1, a principle diagram in a refractive representation of the beam path of a system with two plates with raster elements is illustrated. The light of the primary light source 1 is collected by way of a collector lens 3 and converted into a parallel or convergent light beam. The first raster elements 5 of the first raster element plate 7 decompose the light beam and produce secondary light sources near or at the site of the second raster elements 9. In the example shown at the position of the secondary light sources 11 the pupil plane of the illumination system is defined. The field lens 12 images these secondary sources 11 in the exit pupil of the illumination system which corresponds to the entrance pupil of the subsequent projection objective (not shown). The first raster elements 5 are imaged by the second raster elements 9 and the field lens 12 into the image plane 13 of the illumination system. Preferably in an illumination system in the image plane the reticle 14 is arranged.

Figure 2A:
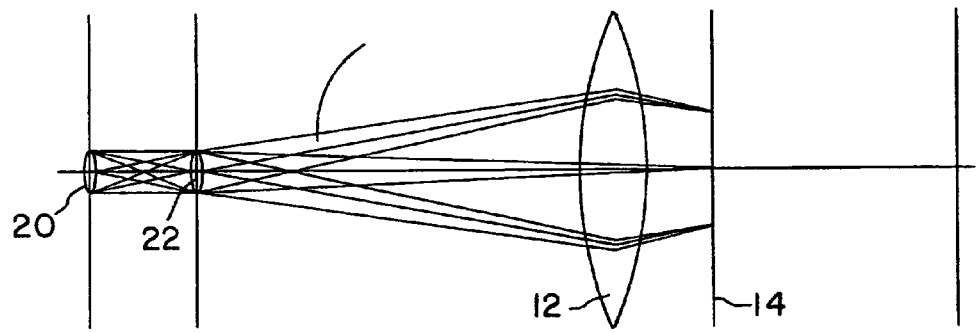
FIG. 2a is a schematic view of an imaging of a field raster element.

In the following paragraph the purpose of the field raster elements as well as the pupil raster elements is described with reference to FIGS. 2A and 2B in a refractive representation for the central pair of field raster element 20 and pupil raster element 22. The field raster element 20 which is in the embodiment described herein of rectangular shape is imaged on the reticle 14 or the mask by way of the pupil raster element 22 and the field lens 12. The field raster elements have not be restriced to field raster elements of rectangular shape, field raster elements having another shape, e.g. an arc shape shape are also possible for practicing the invention. The geometric extension of the field raster element 20 determines the shape of the illuminated field in the reticle plane 14. The image scale is approximately given by the ratio of the distance from pupil raster element 22 to reticle 14 and the distance from field raster element 20 to pupil raster element 22. The field raster element 20 is designed such that an image of primary light source 1, a secondary light source is formed. Preferable the secondary light source lie at or near the site of the secondary raster elements, the so called "pupil raster elements". Due to the high heat load at the site of the secondary light sources the second raster elements are preferably defocused with respect to the secondary light sources, which denotes, that the second raster elements are arranged near the site of the secondary light sources. The second raster elements are also designated as pupil raster elements.

Figure 2B:
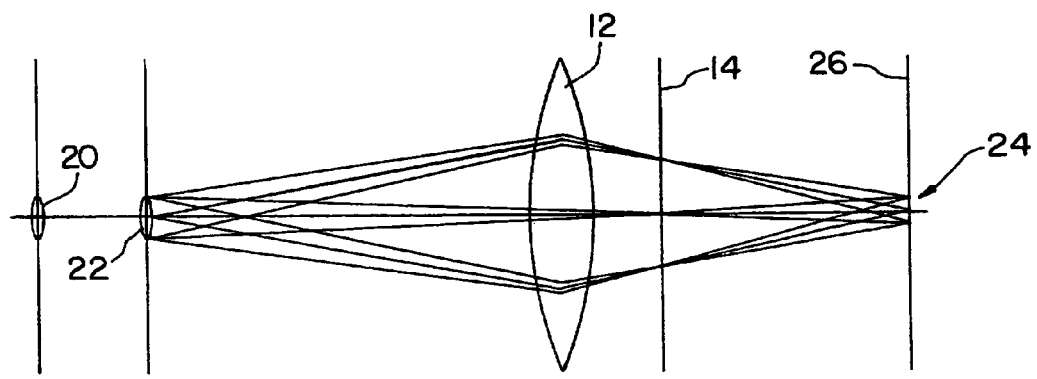
FIG. 2b is a schematic view of an imaging of a pupil imaging of the field and pupil raster elements.

As is shown in FIG. 2B, the task of field lens 12 consists of imaging the secondary light sources in the entrance pupil 26 of projection objective 24 forming tertiary light sources. With the field lens the field imaging can be influenced in such a way that it forms the arc-shaped field by control of the distortion. The imaging scale of the field raster element image is thus almost not changed.

Figure 3:
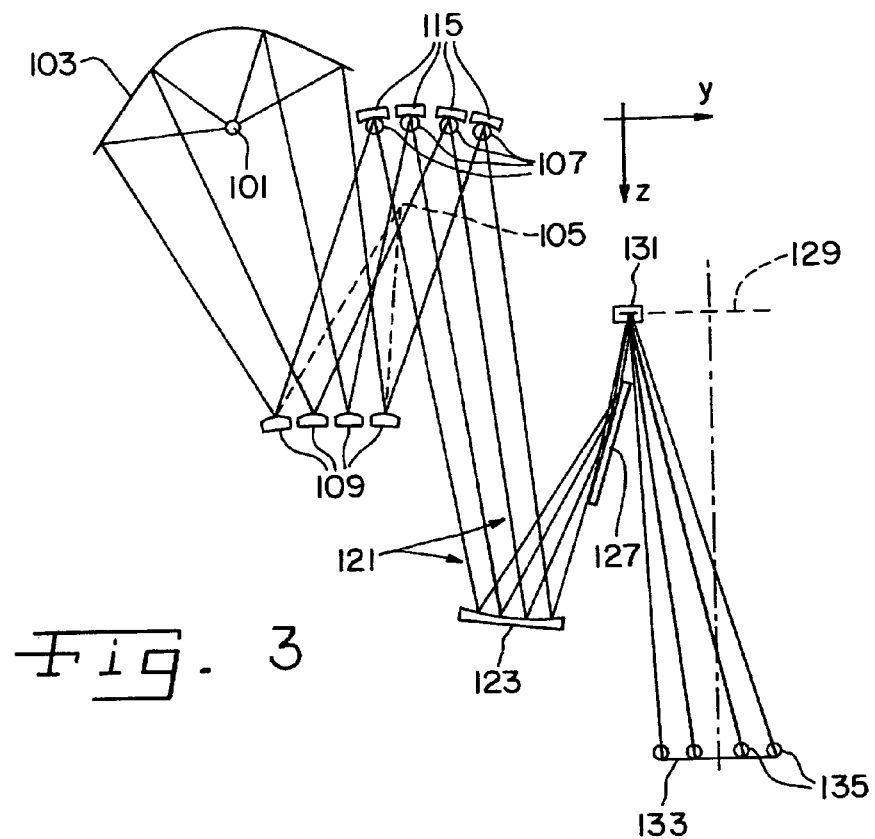
FIG. 3 is a schematic view of a reflective embodiment of a illumination system with convex mirrors as field raster elements and concave mirrors as pupil raster elements.

In FIG. 3 an embodiment for a purely reflective or so called catoptric illumination system in a schematically view is shown. The beam cone of the light source 101 is collected by the ellipsoidal collector mirror 103 and is directed to the plate with the field mirror raster elements 109. The collector mirror 103 is designed to generate an image 105 of the light source 101 between the plate with the field mirror raster elements 109 and the plate with the pupil raster elements 115 if the plate with the field raster elements 109 would be planar as indicated by the dashed lines. The convex field mirror raster elements 109 generate secondary light sources 107 at the pupil mirror raster elements 115, since the light source is a extended light source, also the secondary light sources 107 are extended, which denotes that each of the light sources have a certain shape. The pupil mirror raster elements 115 are designed as concave mirrors to image the field intensity of the raster elements 109 into the image plane 129. Since the intensity of the secondary light sources 107 is very high, the planar pupil mirror raster elements 115 are preferably arranged defocused from the secondary light sources 107. The distance between the secondary light sources 107 and the pupil mirror raster elements 115 should not exceed 20% of the distance between the field raster elements and the pupil mirror raster elements. The pupil mirror raster elements 115 are tilted to superimpose the images of the field mirror raster elements 109 together with the field mirror system 121 formed by the field mirrors 123 and 127 in the field 131 to be illuminated. Both, the field mirror raster elements 109 and the pupil mirror raster elements 115 are tilted. Therefore the assignment between the field mirror raster elements 109 and pupil mirror raster elements 115 is defined by the user. The tilt angles and the tilt axes of the field mirror raster elements are determined by the directions of the incoming ray bundles and by the positions of the corresponding pupil mirror raster elements 115. Since for each field mirror raster element 109 the tilt angle and the tilt axis is different, also the planes of incidence defined by the incoming and reflected centroid rays are not parallel. The tilt angles and the tilt axes of the pupil mirror raster elements 115 are determined by the positions of the corresponding field mirror raster elements 109 and the requirement that the images of the field mirror raster elements 109 has to be superimposed in the field 131 to be illuminated. The concave field mirror 123 images the secondary light sources 107 into the exit pupil 133 of the illumination system forming tertiary light sources 135, wherein the convex field mirror 127 being arranged at grazing incidence transforms the rectangular images of the rectangular field raster elements 109 into arc-shaped images.

Figure 4:
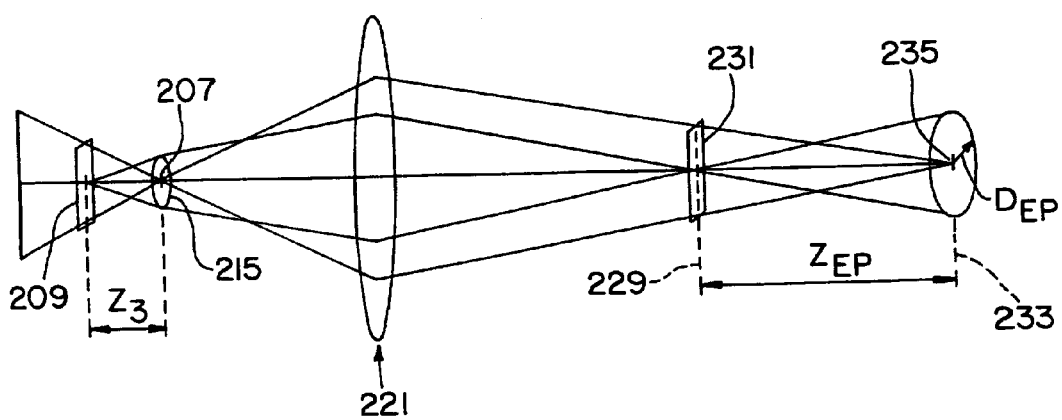
FIG. 4 is a schematic view of the principal setup of the illumination system.

FIG. 4 shows in a schematic view in refractive representation the imaging of one field raster element 209 into the reticle plane 229 forming an image 231 and the imaging of the corresponding secondary light source 207 into the exit pupil 233 of the illumination system forming a tertiary light source 235. Corresponding elements have the same reference numbers as those in FIG. 3 increased by 100. Therefore, the description to these elements is found in the description to FIG. 3.

The field raster elements 209 are rectangular and have a length $X_{FRE}$ and a width $Y_{FRE}$. All field raster elements 209 are arranged on a nearly circular plate with a diameter $D_{FRE}$. They are imaged into the image plane 229 and superimposed on a field 231 with a length $X_{field}$ and a width $Y_{field}$, wherein the maximum aperture in the image plane 229 is denoted by $NA_{field}$. The field size corresponds to the size of the object field of the projection objective, for which the illumination system is adapted.

The plate with the pupil raster elements 215 is arranged in a distance of $Z_3$ from the plate with the field raster elements 209. The shape of the pupil raster elements 215 depends on the shape of the secondary light sources 207. For circular secondary light sources 207 the pupil raster elements 215 are circular or hexagonal for a dense packaging of the pupil raster elements 215. The diameter of the plate with the pupil raster elements 215 is denoted by $D_{PRE}$. According to the invention to improve the geometric filling factor, the shape of each of the pupil raster elements is different and adopted to the shape of the associated secondary light source.

The pupil raster elements 215 are imaged by the field lens 221 into the exit pupil 233 having a diameter of DEP. The distance between the image plane 229 of the illumination system and the exit pupil 233 is denoted with $Z_{EP}$. Since the exit pupil 233 of the illumination system corresponds to the entrance pupil of the projection objective, the distance $Z_{EP}$ and the diameter $D_{EP}$ are predetermined values. The entrance pupil of the projection objective is typically illuminated up to a user-defined filling ratio σ.

The data for a preliminary design of the illumination system can be calculated with the equations and data given below. The values for the parameters are typical for a EUV projection exposure apparatus. But there is no limitation to these values. Wherein the schematic design is shown for a refractive linear system it can be easily adapted for reflective systems by exchanging the lenses with mirrors.

The field 231 to be illuminated is defined by a segment of an annulus. The Radius of the annulus is:

$R_{field}$=138 mm.

The length and the width of the segment are:

$X_{field}$=88 mm, $Y_{field}$=8 mm.

Without the field-forming field mirror, which transforms the rectangular images of the field raster elements into arc-shaped images, the field to be illuminated is rectangular with the length and width defined by the segment of the annulus.

The distance from the image plane to the exit pupil is:

$Z_{EP}$=1320 mm.

The object field of the projection objective is an off-axis field. The distance between the center of the field and the optical axis of the projection objective is given by the radius $R_{field}$. Therefore the incidence angle of the centroid ray in the center of the field is 6°.

The aperture at the image plane of the projection objective is $NA_{wafer}$=0.25. For a reduction projection objective with a magnification ratio of $\rho_{proj}$=−0.25 and a filling ratio of σ=0.8 the aperture at the image plane of the illumination system is:

$$NA_{field} = \sigma \cdot \frac{NA_{wafer}}{4} = 0.05,$$

$$D_{EP} = 2\tan[\arcsin(NA_{field})] \cdot Z_{EP} \approx 2NA_{EP} \cdot Z_{EP} \approx 132\text{mm}.$$

The distance $Z_3$ between the field raster elements and the pupil raster elements is related to the distance $Z_{EP}$ between the image plane and the exit pupil by the depth magnification α:

$Z_{EP}$=α·$Z_3$.

The size of the field raster elements is related to the field size by the lateral magnification $\beta_{field}$:

$X_{field}$=$\beta_{field}$·$X_{FRE}$, $Y_{field}$=$\beta_{field}$·$Y_{FRE}$.

The diameter $D_{PRE}$ of the plate with the pupil raster elements and the diameter $D_{EP}$ of the exit pupil are related by the lateral magnification $\beta_{pupil}$:

$D_{EP}$=$\beta_{pupil}$·$D_{PRE}$.

The depth magnification α is defined by the product of the lateral magnifications $\beta_{field}$ and $\beta_{pupil}$:

$\alpha = \beta_{field} \cdot \beta_{pupil}$.

The number of raster elements being superimposed at the field is set to 200. With this high number of superimposed images the required field illumination uniformity can be achieved.

Another requirement is to minimize the incidence angles on the components. For a reflective system the beam path is bent at the plate with the field raster elements and at the plate with the pupil raster elements. The bending angles and therefore the incidence angles are minimum for equal diameters of the two plates:

$$D_{PRE} = D_{FRE},$$

$$200 \cdot X_{PRE} \cdot Y_{PRE} = 200 \cdot \frac{X_{field} \cdot Y_{field}}{\beta_{field}^2} = \frac{D_{EP}^2}{\beta_{pupil}^2} = \frac{\beta_{field}^2}{\alpha^2} D_{EP}^2.$$

The distance $Z_3$ is set to $Z_{3=900}$ mm. This distance is a compromise between low incidence angles and a reduced overall length of the illumination system.

$$\alpha = \frac{Z_{EP}}{Z_3} = 1.47$$

Therefore:

$$|\beta_{field}| \approx \sqrt[4]{\frac{200 \cdot X_{field} \cdot Y_{field}}{D_{EP}^2} \alpha^2} \approx 2.05$$

$$|\beta_{pupil}| \approx \frac{\alpha}{\beta_{field}} \approx 0.7$$

$$D_{FRE} = D_{PRE} = \frac{\beta_{field}}{\alpha} D_{EP} \approx 200 \text{mm}$$

$$X_{FRE} = \frac{X_{field}}{\beta_{field}} \approx 43 \text{mm}$$

$$Y_{FRE} = \frac{Y_{field}}{\beta_{field}} \approx 4 \text{mm}$$

With these values the principal layout of the illumination system is known.

Figure 5:
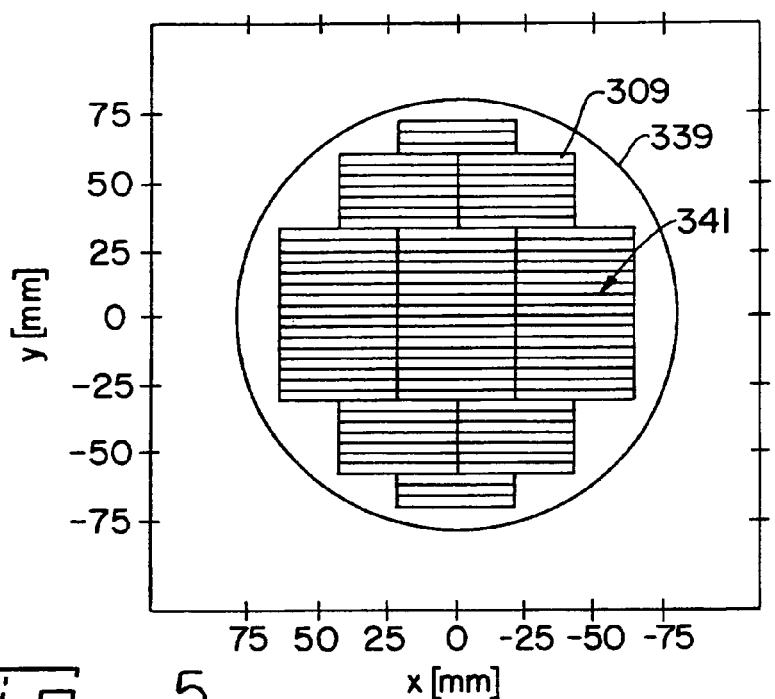
FIG. 5 is a front view of an arrangement of the filed raster elements on a field raster element plate.

In FIG. 5 a two-dimensional arrangement of reflective first raster elements, so called field mirror raster elements 309 on a so called field raster element plate is shown. The distance between each of the field raster elements 309 is as small as possible. Field mirror raster elements 309, which are only partially illuminated, will lead to uniformity errors of the intensity distribution in the image plane, especially in the case of a restricted number of field mirror raster elements 309. Therefore only those field mirror raster elements 309 are imaged into the image plane which are illuminated almost completely. FIG. 5 shows a possible arrangement of 122 field mirror raster elements 309. The solid line 339 represents the border of the circular illumination of the plate with the field raster elements 309. Therefore the filling efficiency is approximately 90%. The rectangular field mirror raster elements 309 have a length $X_{FRE}$=43.0 mm and a width $Y_{FRE}$=4.0 mm. All field raster elements are inside the circle 339 with a diameter of 150 mm. The field raster elements 309 are arranged in rows 341 being arranged one among another. The field raster elements 309 in the rows 341 are attached at the smaller y-side of the field raster elements 309. The rows 341 consist of one, two or three raster elements 309. Some rows 341 are displaced relative to the adjacent rows 341 to distribute the field raster elements 309 inside the circle 339. The distribution is symmetrical to the y-axis.

Figure 6A:
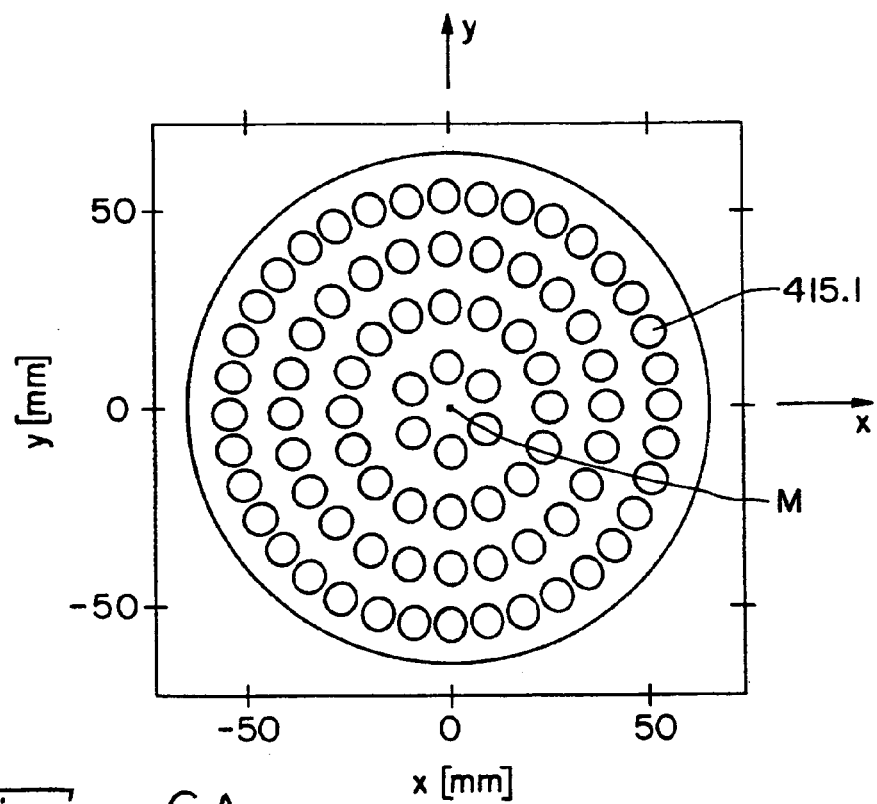
FIG. 6A is a front view of an arrangement of the pupil raster elements on a pupil raster element plate for round-shaped secondary light sources.

FIG. 6A shows at first arrangement of pupil mirror raster elements 415.1. In FIG. 6A the pupil raster elements 415.1 are arranged point symmetric to the center of the coordinate system. This arrangement illustrates the difference between the state of the art and the inventive concept. As is apparent from FIG. 6A all pupil raster elements have the same size and shape.

Figure 6B:
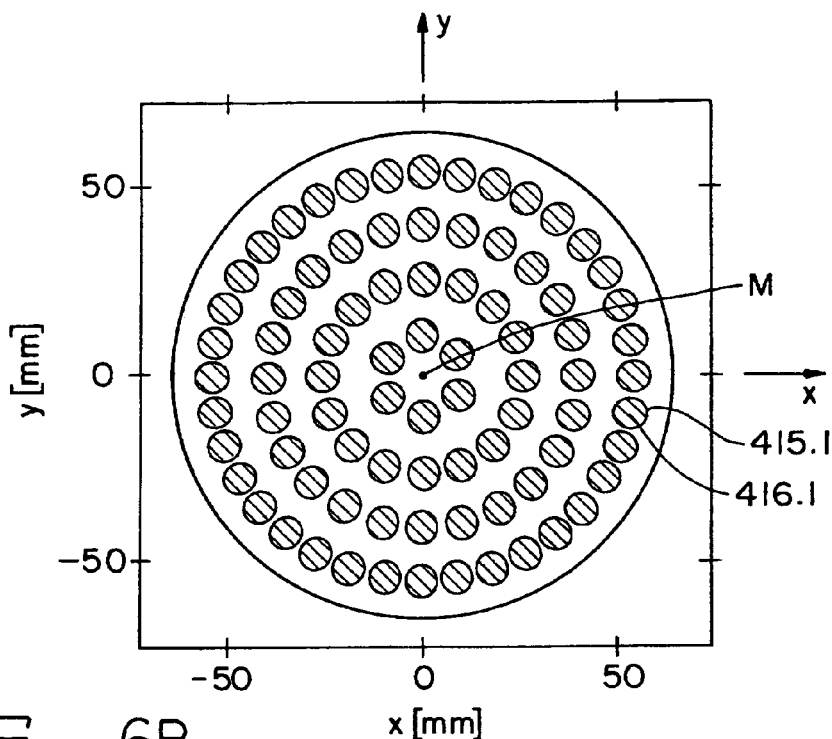
FIG. 6B is a front view of a pupil raster element plate with a plurality of pupil raster elements and the corresponding secondary light sources. The shape of all pupil raster elements is equal.

The shape of the pupil mirror raster elements 415.1 correspond to the shape of the secondary light sources in the plane, in which pupil mirror raster element plate with pupil mirror raster elements is arranged as shown in FIG. 6B. The secondary light sources 416.1 have the same shape as the pupil mirror raster elements 415.1. In the example shown the secondary light sources 416.1 as well as the pupil mirror raster elements are of circular shape.

Figure 6C:
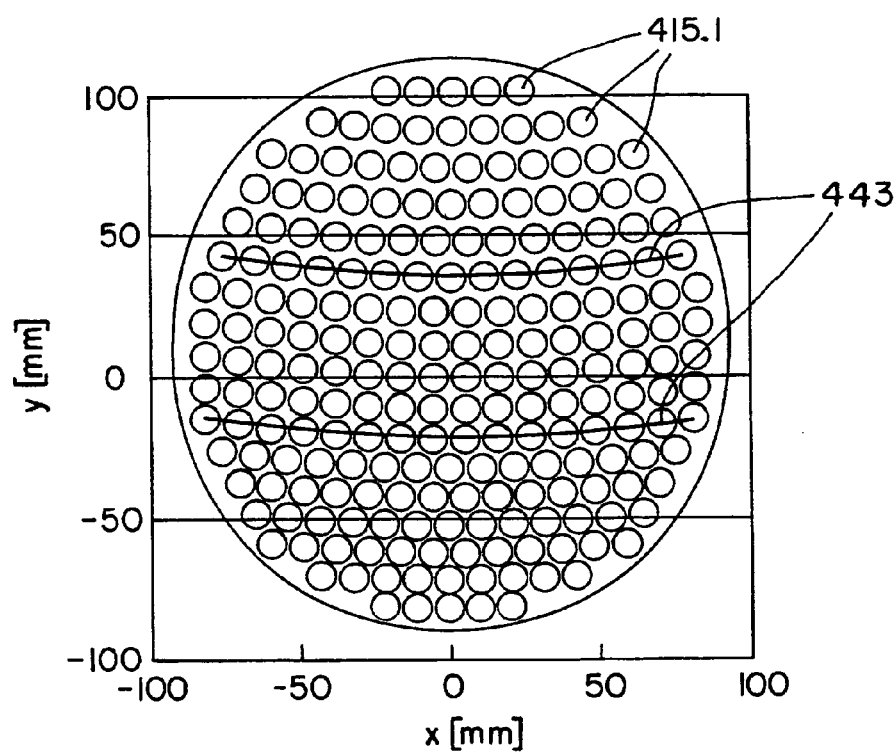
FIG. 6C is a front view of a pupil raster element plate with a plurality of pupil raster elements of equal shape on a distorted grid.

In FIG. 6C a preferred embodiment of a pupil mirror raster element plate is shown. The pupil mirror raster elements 415.1 according to FIG. 6C all have the same shape, but they are arranged on a distorted grid to compensate for the distortion errors of the field mirror system. If this distorted grid of pupil mirror raster elements 415.1 is imaged into the exit pupil of the illumination system by the field mirror system a undistorted regular grid of tertiary light sources will be generated. The pupil mirror raster elements 415.1 are arranged on curved lines 443 to compensate the distortion introduced by the field-forming field mirror. The distance between adjacent pupil mirror raster elements 415.1 is increased in y-direction to compensate the distortion introduced by field mirrors being tilted about the x-axis. The size of the pupil mirror raster elements 415.1 depends on the source size or source etendue. If the source etendue is much smaller than the required etendue in the image plane, the secondary light sources will not fill the plate with the pupil mirror raster elements 415.1 completely. In this case the pupil mirror raster elements 415.1 need only to cover the area of the secondary light sources plus some overlay to compensate for source movements and imaging aberrations of the collector-field raster element unit. In FIG. 6C circular pupil raster elements 415.1 are shown. The circular shape for the pupil raster elements is favorable in case of circular secondary light sources. In case the secondary light sources have e.g. an elliptic shape it is favorable that also the pupil raster element is of elliptic shape.

If the shape of the secondary light sources varies for each of the plurality of light sources, then according to the invention the shape of the pupil raster elements should also vary. This is shown in FIGS. 7A-7D.

Figure 7A:
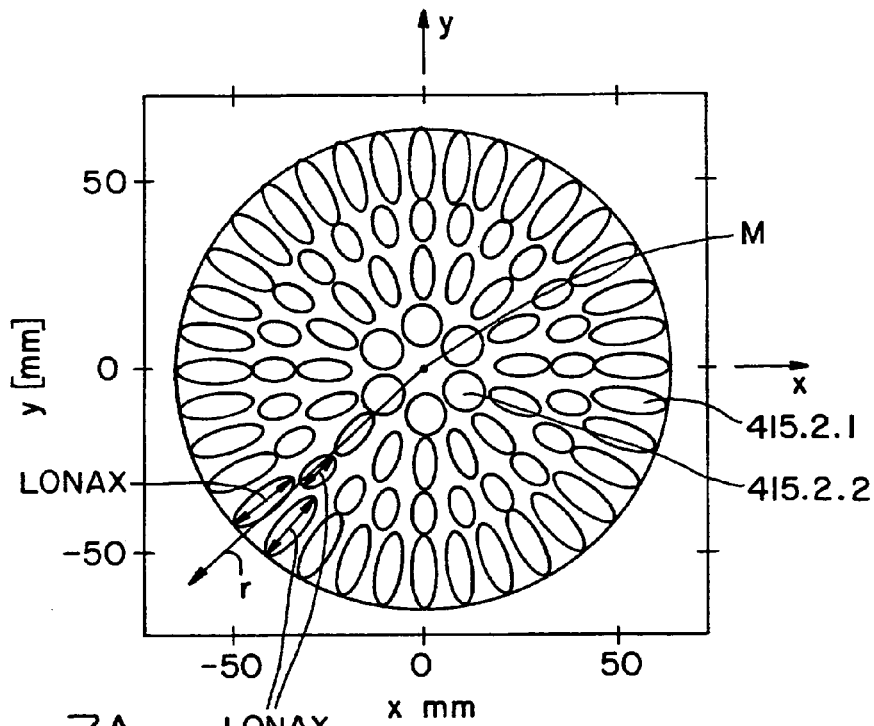
FIG. 7A is a front view of a first embodiment of a raster element plate with pupil raster elements of different shape.

In FIG. 7A a first embodiment of a plurality of pupil mirror raster elements on a pupil mirror raster element plate is shown. Each of the pupil mirror raster elements have a different shape, i.e. the shape of a first pupil raster element 415.2.1 is different to the shape of a second pupil raster element 415.2.2. In the example shown the shape of the first pupil raster element 415.2.1 is elliptical, whereas the shape of the second pupil raster element 415.2.2 is round-shaped. In the embodiment all pupil mirror raster elements are radially oriented, which denotes that one axis LONAX of each pupil mirror raster element 415.2.1 of elliptic shape is oriented in radial direction r. Such an arrangement is preferred, but not necessary. The orientation of the elliptic pupil raster elements can be totally irregular as shown in FIG. 7D. Moreover the shape of the pupil mirror raster elements can be other than elliptic or circular. The shape and/or the distribution of the pupil mirror raster elements is preferably chosen such that more than 70%, preferably more than 80%, most preferably more than 90% of the exit pupil is illuminated.

Figure 7B:
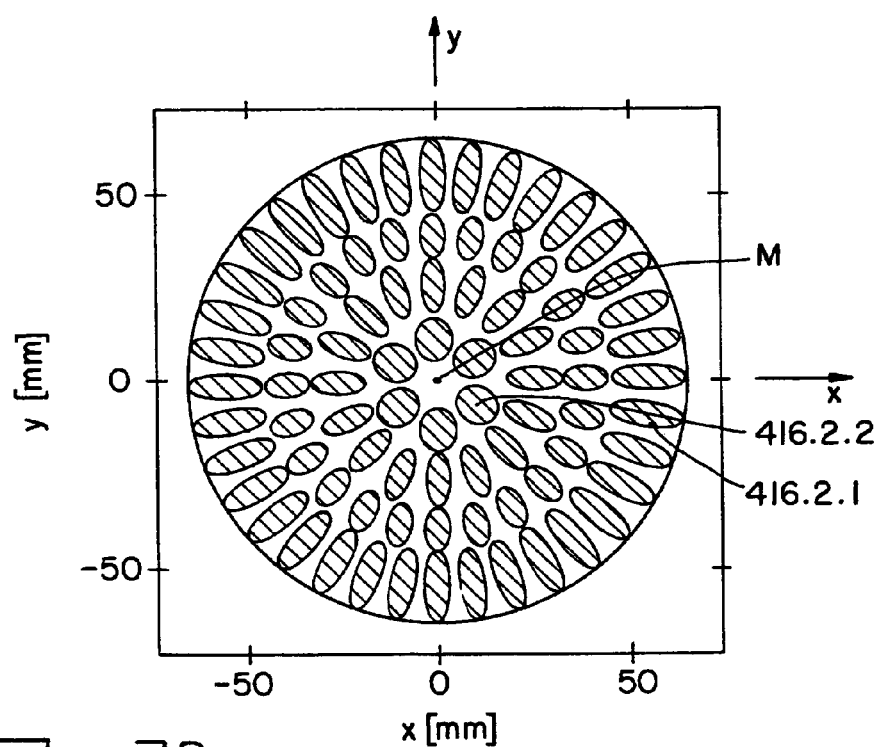
FIG. 7B is a front view of a secondary light sources of different shape in a system with a raster element plate according to FIG. 7A.

In FIG. 7B the secondary light sources in the plane in which the pupil raster element plate is situated are shown. As is apparent from FIG. 7B the secondary light sources also have different shape, e.g. the first secondary light source 416.2.1 has a different shape than the second secondary light source 416.2.2. The shape of the first secondary light source 416.2.1 is elliptical, whereas the shape of the second secondary light sources is round. This shape of the light source is preferable, but not necessary.

Figure 7C:
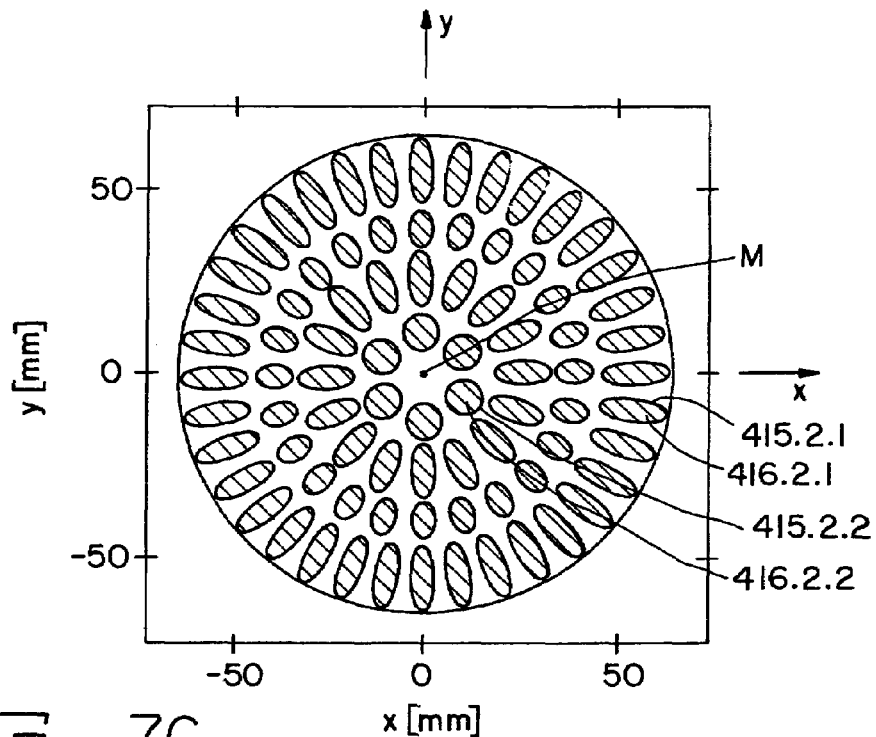
FIG. 7C is a front view of a first embodiment of a raster element plate with pupil raster elements and secondary light sources of different shape.
Figure 7D:
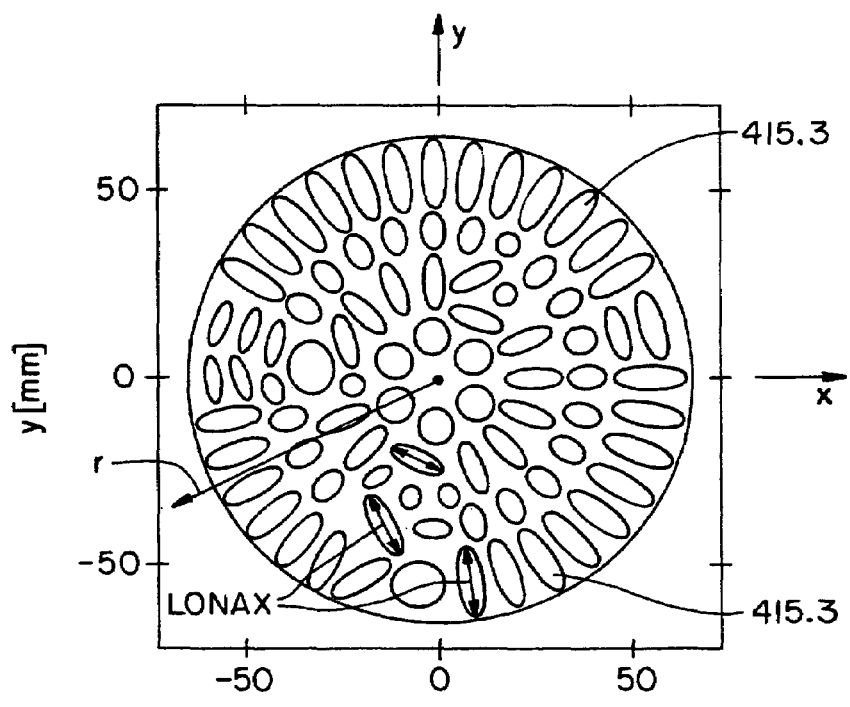
FIG. 7D is a front view of a second embodiment of a raster element plate with pupil raster elements of different size and different orientation.

In FIG. 7C the pupil mirror raster elements 415.2.1, 415.2.2 as well as the secondary light sources 416.2.1, 416.2.2 are shown. As is apparent from FIG. 7C the shape of each pupil mirror raster element is chosen similar to the shape of the corresponding secondary light source in the plane, in which the pupil mirror raster element is situated. In case the shape of a secondary light source in this plane is e.g. elliptical, then the corresponding pupil mirror raster element such as pupil raster element 415.2.1 is also of elliptical shape, whereas if the shape of the secondary light source is circular, then the corresponding pupil mirror raster element such as pupil raster element 415.2.2 is also of circular shape.

In FIG. 7D a second embodiment of the invention is shown. According to FIG. 7D the pupil raster elements 415.3 are also corresponding to the shape of each secondary light source; i.e. elliptic pupil mirror raster elements correspond to elliptic secondary light sources and round-shaped pupil mirror raster elements to round-shaped light source. In contrast to FIG. 7A the light sources are distributed arbitrary. Therefore also the pupil mirror raster elements are distributed arbitrary. The distribution of the light sources and therefore of the pupil mirror raster elements on the raster element plate depends upon the assignment of field mirror raster elements to pupil mirror raster elements.

According to the invention by adapting the shape of each of the pupil raster elements to the shape of the secondary light sources or/and the distribution of the pupil mirror raster elements on the raster element plate in the plane, in which the pupil raster elements are situated, the geometric filling factor is greater than 70%, preferably greater than 80%, most preferably greater than 90%. This means, that an area in an exit pupil is illuminated to more than 70%, preferably more than 80%, most preferably more than 90%.

In most of the EUV illumination systems EUV light sources are used, which have an elliptical shape. Therefore the secondary light sources also have an elliptical shape and consequently according to the invention also the pupil raster elements.

According to the present invention each field raster element 309 corresponds to one of the pupil raster elements 415.1, 415.2.1, 415.2.2 according to an assignment table and is tilted to deflect an incoming ray bundle to the corresponding pupil raster element 415.1, 415.2.1, 415.2.2. A ray coming from the center of the light source and intersecting the field raster element 309 at its center is deflected to intersect the center of the corresponding pupil raster element 415.1, 415.2.1, 415.2.2. The tilt angle and tilt axis of the pupil raster element 415.1, 415.2.1, 415.2.2 is designed to deflect this ray in such a way, that the ray intersects the field in its center. Each field raster element 309 to which a pupil raster element is assigned forms a light channel.

The field lens images the plate with the pupil raster elements into the exit pupil and generates the arc-shaped field with the desired radius $R_{field}$. For $R_{field}$=138 mm, the field forming gracing incidence field mirror has only low negative optical power. The optical power of the field-forming field mirror has to be negative to get the correct orientation of the arc-shaped field. Since the magnification ratio of the field mirror or field mirror system has to be positive, another field mirror with positive optical power is required. Wherein for apertures $NA_{field}$ lower than 0.025 the field mirror with positive optical power can be a grazing incidence mirror, for higher apertures the field mirror with positive optical power should be a normal incidence mirror.

Figure 8A:
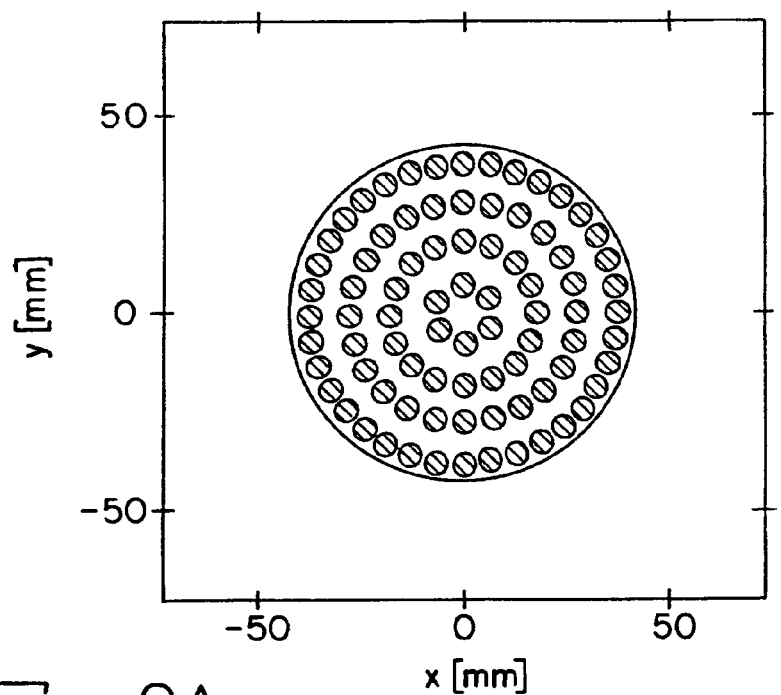
FIG. 8A is a front view of an illumination of the exit pupil of the illumination system of the embodiment of FIG. 3 with an arrangement of pupil raster elements each having a round shape.
Figure 8B:
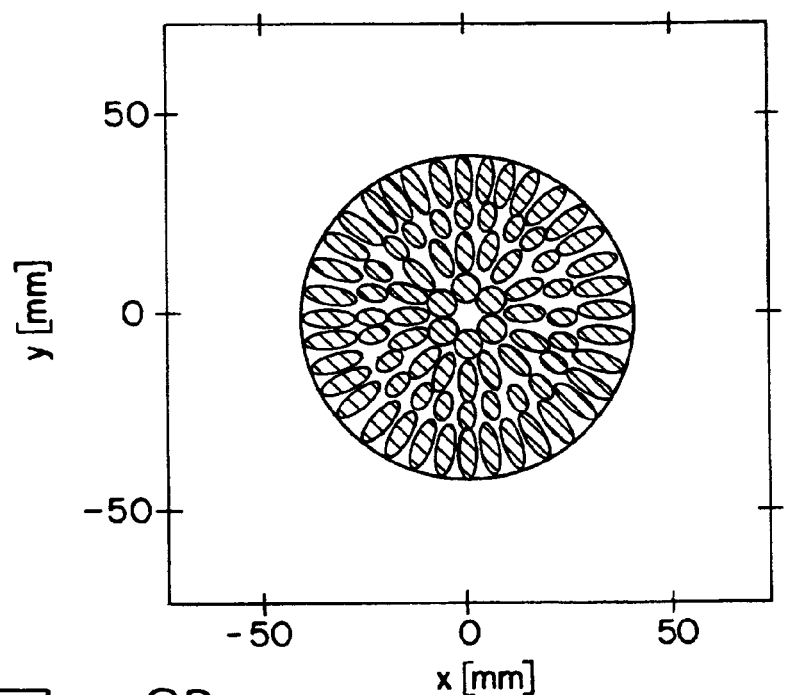
FIG. 8B is a front view of an illumination of the exit pupil of the embodiment according to FIG. 3 with an arrangement of pupil raster elements having a different shape for different second raster elements, wherein the shape is adopted to the shape of the secondary light sources.

FIGS. 8A and 8B shows the illumination of the exit pupil 133 for an object point in the center (x=0 mm; y=0 mm) of the illuminated field in the image plane 131 illumination system shown in FIG. 3. The arrangement of the tertiary light sources 135.1, 135.2.1, 135.2.2 in the exit pupil corresponds to the arrangement and the shape of the pupil raster elements 415.1, 415.2.1, 415.2.2. In case a field mirror system is used the pupil raster elements are preferably arranged on a distorted grid as shown in FIG. 6C. Then the tertiary light sources 135 are also arranged on a undistorted regular grid, since in a real illumination system as shown in FIG. 3 the distortion errors of the imaging of the secondary light sources due to the tilted field mirrors and the field-shaping field mirror are compensated. If a Laser-Plasma-Source is used as a light source, the shape of the pupil raster elements is elliptical since the shape of the Laser-Plasma-Source is not spherical but ellipsoidal. If the source ellipsoid is oriented in the direction of the local optical axis, the tertiary light sources are not circular, but elliptical.

If the pupil mirror raster elements are all of the same shape as shown in FIG. 6A, than the geometric filling degree of the exit pupil in the embodiment is about 63% as shown in FIG. 8A. A better filling degree is reached if the pupil raster element plate has a plurality of pupil mirror raster elements of different shape adapted to the shape of the secondary light source as shown in FIG. 8B. According to FIG. 8B each of the plurality of pupil mirror raster elements have the shape of the corresponding secondary light source in the plane, in which the pupil mirror raster element is arranged. Such a pupil mirror raster element plate is shown in FIG. 7A. As shown in FIG. 8B the filling degree in the exit pupil is greater than 78%.

Figure 9:
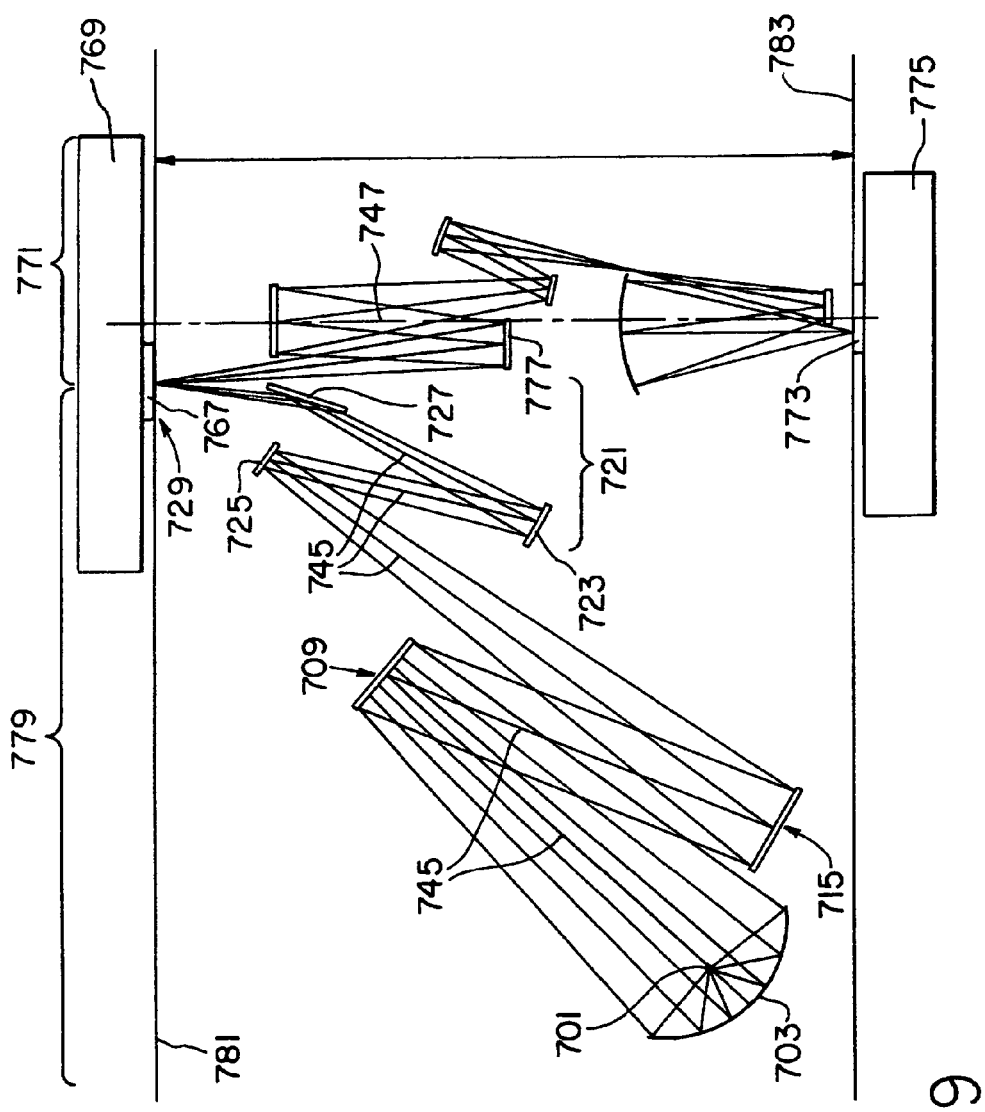
FIG. 9 is a schematic detailed view of a projection exposure apparatus.

FIG. 9 shows a EUV projection exposure apparatus in a detailed view. The illumination system is the same as shown in detail in figure. Corresponding elements have the same reference numbers as those in FIG. 3 increased by 700. Therefore, the description to these elements is found in the description to FIG. 3. In the image plane 729 of the illumination system the reticle 767 is arranged. The reticle 767 is positioned by a support system 769. The projection objective 771 having six mirrors images the reticle 767 onto the wafer 773, which is also positioned by a support system 775. The mirrors of the projection objective 771 are centered on a common straight optical axis 747. The arc-shaped object field is arranged off-axis. The direction of the beam path between the reticle 767 and the first mirror 777 of the projection objective 771 is convergent to the optical axis 747 of the projection objective 771. The angles of the chief rays 745 with respect to the normal of the reticle 767 are between 5° and 7°. As shown in FIG. 9, the illumination system 779 is well separated from the projection objective 771. The illumination and the projection beam path interfere only nearby the reticle 767. The beam path of the illumination system is folded with reflection angles lower than 25° or higher than 75° in such a way that the components of the illumination system are arranged between the plane 781 with the reticle 767 and the plane 783 with the wafer 773.

Figure 10:
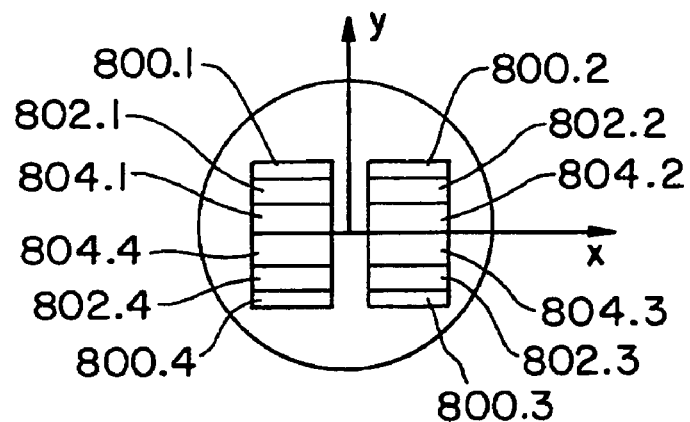
FIG. 10 is a front view of a first raster element plate with twelve first raster elements.

A raster element plate with first raster elements as shown having raster elements of different size, i.e. extension in y-direction and therefore different aspect ratio is shown in FIG. 10. FIG. 10 shows a raster element plate with four first raster elements with a first extension in y-direction 800.1, 800.2, 800.3 800.4, four first raster elements with a second extension in y-direction 802.1, 802.2, 802.3, 803.4 and four first raster elements with a third extension in y-direction 804.1, 804.2, 804.3, 804.4. The raster elements are arranged symmetric on the raster element plate in respect to the x- and the y-axis.

Figure 11:
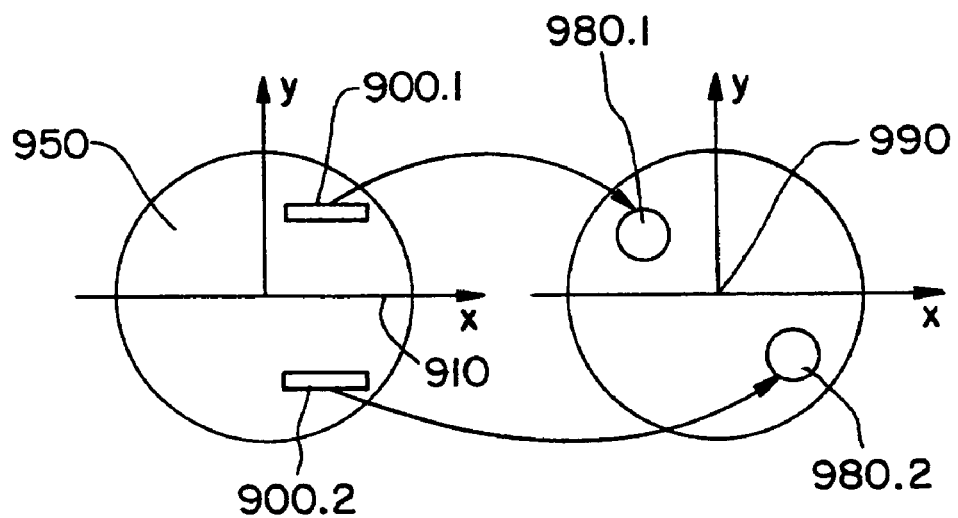
FIG. 11 is a schematic view of an assignment of axis symmetric first raster elements to point-symmetric second raster elements.

For obtaining also a sufficient telecentricity during the scan process it is necessary to fill the exit pupil for each field point for the different first raster elements of different size with tertiary light sources in a uniform manner. This can be achieved if the deflection angles of the deflected ray bundle of the plurality of the first raster elements is chosen in such a manner that the corresponding plurality of second raster elements are nearly point symmetric to the center of the pupil raster element plate shown, for example, in FIG. 11. In this application nearly point symmetric denotes that the telecentricity error in the exit pupil for each field point is less than 1 mrad (milliradian), preferably less than 0,1 mrad. Since the tertiary light sources in the exit pupil for each field point of the object field corresponds to the arrangement of the second raster elements on the pupil raster element plate, the exit pupil of each field point is also filled point symmetric with tertiary light sources as shown in FIG. 11. FIG. 11 shows schematically the principle of arrangement of first and second raster elements. Two first raster elements 900.1 and 900.2 of identical size, which are arranged symmetrically with respect to an axis of symmetry 910 in the first raster element plate 950. In this case the axis of symmetry is the x-axis, which is perpendicular to the scanning direction. The deflection angles of the first raster elements 900.1 and 900.2 are chosen such that the corresponding pupil facets 980.1 and 980.2 are arranged point symmetrically with respect to the center of the second raster element plate 990.

As discussed before the light source, which illuminates the first raster element plate is denoted as primary light source. The plurality of first raster elements forms a plurality of secondary light sources. The second raster element plate is arranged in or near the site of the secondary light sources.

Figure 12:
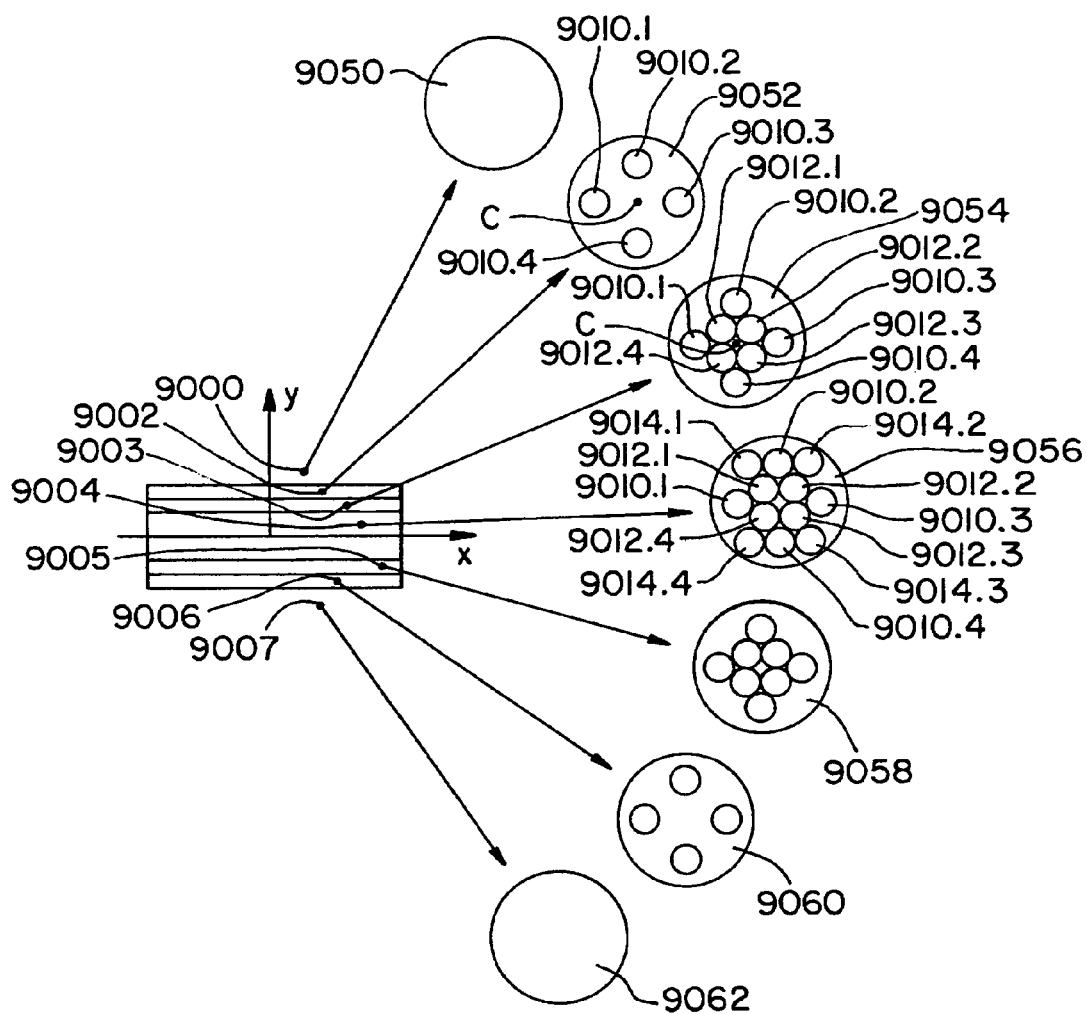
FIG. 12 is a schematic view of a field in an image plane and exit pupils for different field points.

The exit pupil for seven field points is shown in FIG. 12. Point 9000 lies outside the field in the image plane. Therefore no illumination occurs in the exit pupil 9050 for this point. Point 9002 lies within the filed. The images of the first raster elements 804.1, 804.2, 804.3, 804.4 of the filed raster element plate shown in FIG. 10 are superimposed in this field point. Therefore four tertiary light sources 9010.1, 9010.2, 9010.3, 9010.4 illuminate the exit pupil 9052. The four tertiary light sources 9010.1, 9010.2, 9010.3, 9010.4 are symmetric to the center C of the exit pupil.

In field point 9003 the images of eight first raster elements 804.1, 804.2, 804.3, 804.4, 802.1, 802.2, 802.3, 802.4 of the raster element plate shown in FIG. 10 are superimposed. In the exit pupil 9054 eight uniformly distributed tertiary light sources 9010.1, 9010.2, 9010.3, 9010.4, 9012.1, 9012.2, 9012.3, 9012.4 are depicted which are point symmetric to the center of the exit pupil.

In field point 9004 the images of all twelve first raster elements 804.1, 804.2, 804.3, 804.4, 802.1, 802.2, 802.3, 802.4, 800.1, 800.2, 800.3, 800.4 of the raster element plate in FIG. 10 are superimposed. In the exit pupil 9056 twelve uniformly distributed tertiary light sources 9010.1, 9010.2, 9010.3, 9010.4, 9012.1, 9012.2, 9012.3, 9012.4, 9014.1, 9014.2, 9014.3, 9014.4 are depicted which are point symmetric to the center of the exit pupil.

For field point 9005 the images of eight first raster elements are superimposed. The situation corresponds to the situation in field point 9003. The exit pupil 9058 is illuminated by eight tertiary light sources.

For field point 9006 the images of four first raster elements are superimposed. The situation corresponds to the situation in field point 9002. The exit pupil 9060 is illuminated by four tertiary light sources. Point 9007 lies outside the field, therefore the exit pupil 9062 is not illuminated.

If one scans an object in y-direction at the beginning 4 tertiary light sources are turned on then 8 and at last 12 light sources are turned on. Then four light sources to a total of eight light sources are turned off, in the next step further four light sources to a total of four light sources are turned off and outside the field in the image plane the exit pupil is not illuminated.

As a result of the special assignment of first raster elements and second raster elements the center of gravity of the illumination of the exit pupil is located in the center of the exit pupil for each field point. Thus the telecentricity of the illumination system does not depend on the field position, a prerequisite for telecentric wafer exposure. The described feature of the exit pupil holds for any axially symmetric illumination of the first raster elements and is purely based on the assignment of first and second raster elements.

According to the present invention an illumination system is provided which is insensitive to fluctuations of the pulse sequence of the primary light source. Moreover the illumination system according to the invention is characterized by an optimal telecentricity during all phases of the scan process. In contrast to that illumination systems of the state of the art consider only scanning integrated telecentricity.

Furthermore, the illumination system is characterized in that more than about 70%, especially more than about 80%, especially more than about 90% of an area of an exit pupil is illuminated.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. An illumination system having a light source emitting light having a wavelength, comprising:
   a first optical component with a plurality of field mirror raster elements receiving said light from said light source; and
   a second optical component with a plurality of pupil mirror raster elements receiving said light from said field mirror raster elements, said plurality of pupil mirror raster elements having at least a first pupil raster element including a first shape and a second pupil mirror raster element having a second shape, said first shape being substantially different from said second shape.

2. The illumination system of claim 1, wherein said wavelength is not greater than 193 nm.

3. The illumination system of claim 1, wherein said light includes wavelengths in an EUV-region.

4. The illumination system of claim 1, wherein said plurality of field mirror raster elements have at least a first field mirror raster element and a second field mirror raster element, said first field mirror raster element produces a first image of said light source having a first light source shape and said second field mirror raster element produces a second image of said light source having a second light source shape.

5. The illumination system of claim 4, wherein said first light source shape corresponds substantially to said first shape of said first pupil mirror raster element and said second light source shape corresponds substantially to said second shape of said second pupil mirror raster element, said first light source shape being substantially different from said second light source shape.

6. The illumination system of claim 1, wherein said illumination system has an exit pupil, said exit pupil has an area, said plurality of field mirror raster elements are arranged so that more than about 70% of said area is illuminated.

7. The illumination system of claim 6, wherein more than about 80% of said area is illuminated.

8. The illumination system of claim 7, wherein more than about 90% of said area is illuminated.

9. The illumination system of claim 6, wherein said first light source shape corresponds substantially to said first shape of said first pupil mirror raster element.

10. The illumination system of claim 6, wherein said second optical element has one of a substrate and a raster element plate on which a plurality of said pupil mirror raster elements are arranged so that more than about 70% of said area is illuminated.

11. The illumination system of claim 6, wherein said plurality of pupil mirror raster elements are arranged on said raster element plate so that more than 80% of said area is illuminated.

12. The illumination system of claim 11, wherein said plurality of pupil mirror raster elements are arranged on said raster element plate so that more than 90% of said area is illuminated.

13. The illumination system of claim 1, wherein one of said first plurality of field mirror raster elements correspond to one of said second plurality of pupil mirror raster elements, said first plurality of said field mirror raster elements divides light of said light source into a first plurality of ray bundles and deflects said first plurality of ray bundles to said corresponding one of said second plurality of pupil mirror raster elements, at least two of said first plurality of field mirror raster elements are arranged symmetric to an axis of symmetry, and said first plurality of said field mirror raster elements deflects said first plurality of first ray bundles with first deflection angles to said corresponding one of said second plurality of pupil mirror raster elements to fill an exit pupil substantially point symmetric to a center of an exit pupil.

14. The illumination system of claim 13, wherein said first plurality of field mirror raster elements are arranged in rows, at least one of said rows is displaced relative to an adjacent row.

15. The illumination system of claim 13, wherein said first plurality of field raster elements includes mirrors which are tilted to generate said first deflection angles.

16. The illumination system of claim 13, wherein said first plurality of field mirror raster elements are arranged in a two-dimensional array having an illuminated area, and 90% of said first plurality of field mirror raster elements are arranged substantially completely inside said illuminated area.

17. The illumination system of claim 13, wherein said second plurality of pupil mirror raster elements deflects said plurality of deflected ray bundles with second deflection angles to superimpose a plurality of images of said first plurality of field mirror raster elements at least partially on a field.

18. The illumination system of claim 17, wherein at least two of said second deflection angles are different from one another.

19. A projection exposure apparatus for microlithography, comprising:
  a first optical component with a plurality of field mirror raster elements receiving light from a light source;
  a second optical component with a plurality of pupil mirror raster elements receiving light from said field mirror raster elements, said plurality of pupil mirror raster elements including at least a first pupil raster element having a first shape and a second pupil mirror raster element having a second shape, wherein said first shape is substantially different from said second shape;
  a first object being located at an object plane;
  a light-sensitive object on a support system; and
  a projection objective to image said first object onto said light-sensitive object.

20. The projection exposure apparatus of claim 19, wherein said first object is a reticle.

21. A method for a production of microelectronic components with a projection exposure system, comprising the steps of:
  receiving light with a first optical component with a plurality of field mirror raster elements from a light source;
  receiving light from said field mirror raster elements with a second optical component with a plurality of pupil mirror raster elements, said plurality of pupil mirror raster elements including at least a first pupil raster element having a first shape and a second pupil mirror raster element having a second shape, wherein said first shape is substantially different from said second shape;
  providing a first object being located at an object plane;
  providing a light-sensitive object on a support system; and
  imaging said first object onto said light-sensitive object with a projection objective.

22. The method of claim 21, wherein said microelectronic components are semiconductor components.

23. The method of claim 21, wherein said first object is a reticle.

* * * * *